United States Patent
Iwasaka et al.

(10) Patent No.: US 7,360,322 B2
(45) Date of Patent: Apr. 22, 2008

(54) NON-CONTACTING CONVEYANCE EQUIPMENT

(75) Inventors: Hitoshi Iwasaka, Yamanashi (JP); Hideyuki Tokunaga, Yamanashi (JP)

(73) Assignee: Harmotec Co., Ltd., Yamanashi (JP)

( * ) Notice: Subject to any disclaimer, the term of this patent is extended or adjusted under 35 U.S.C. 154(b) by 0 days.

(21) Appl. No.: 09/930,159

(22) Filed: Aug. 16, 2001

(65) Prior Publication Data

US 2003/0033728 A1 Feb. 20, 2003

(51) Int. Cl.
*F26B 17/10* (2006.01)

(52) U.S. Cl. .................. 34/576; 294/64.1; 297/98; 414/737; 901/40

(58) Field of Classification Search .................. 34/576, 34/592, 586; 294/64.1, 64.2, 64.3; 269/21; 271/97, 98, 195; 414/225, 737, 752; 901/40
See application file for complete search history.

(56) References Cited

U.S. PATENT DOCUMENTS

| | | | | |
|---|---|---|---|---|
| 3,438,668 A | * | 4/1969 | Olsson et al. | 294/64 |
| 4,009,785 A | * | 3/1977 | Trayes | 414/676 |
| 4,610,473 A | * | 9/1986 | Hawkswell | 294/64.1 |
| 5,067,762 A | * | 11/1991 | Akashi | 294/64.3 |
| 6,095,582 A | * | 8/2000 | Siniaguine et al. | 294/64.3 |
| 6,099,056 A | * | 8/2000 | Siniaguine et al. | 294/64.3 |
| 6,168,697 B1 | | 1/2001 | Siniaguine et al. | |
| 6,402,843 B1 | * | 6/2002 | Siniaguine et al. | 118/500 |

FOREIGN PATENT DOCUMENTS

| | | |
|---|---|---|
| EP | 0 807 964 A1 | 11/1997 |
| JP | 03-46250 | 2/1991 |
| JP | 10-012710 | 1/1998 |
| JP | 11-254369 | 9/1999 |
| JP | 11-330203 | 11/1999 |
| SU | 537924 | 5/1976 |

OTHER PUBLICATIONS

WO 99/46806 (Corresponding English Publication of JP11-330203).

* cited by examiner

*Primary Examiner*—Kenneth Rinehart
(74) *Attorney, Agent, or Firm*—Staas & Halsey LLP

(57) ABSTRACT

A non-contacting conveyance equipment comprises: a body having an end face that opposes an object to be conveyed, and a concave opening formed in the end face and surrounded by a cylindrical inner side wall; and a fluid passageway having a plurality of pairs of spouts to introduce fluid into an inner space of the concave opening in a circumferential direction of the cylindrical inner side wall so as to cause a swirl of fluid within the concave opening, each of the plurality of pairs of spouts being formed on the cylindrical inner side wall symmetrically to a central axis of the concave opening. A plurality of the non-contacting conveyance equipments may be provided on a base.

9 Claims, 14 Drawing Sheets

NON-CONTACTING CONVEYANCE EQUIPMENT

BACKGROUND OF THE INVENTION

1. Field of the Invention

The present invention relates to non-contacting conveyance equipment used in rotation etc.

2. Description of the Related Art

In recent years, as the use of integrated circuit cards, smart cards, etc., has increased, and the uses and types of such products have become more diverse, wafers have become thin, and the diameter of wafers has increased. Wafers 0.5 mm thick and 10 inches in diameter have been developed. Such thin and large wafers curve or crack easily.

Thus it is difficult to avoid cracking a wafer when conveying it to be processed or moving it within a processing stage for manufacturing integrated circuits. That is, the mechanical integrity of a wafer decreases as the diameter of the wafer increases, or as the thickness of the wafer decreases. For this reason, non-contacting conveyance equipment is proposed. Non-contacting conveyance equipment holds and conveys a wafer by non-contacting means using air, nitrogen gas, and the like, and such means are already in practical use.

For example, in JP 11-254369, air is introduced through an air inlet into a chamber. Within the chamber, the air flows about a rotational flow generating plate and is then deployed to the inside of a bell mouth. The air enters the bell mouth while turning, and is directed out of the bell mouth over a flat surface at the parameter of the bell mouth. An object to be carried rests within the bell mouth.

One problem associated with the device disclosed in JP11-254369 is that, because air is introduced from an inlet above the bell mouth, a large amount of air is necessary. In addition to consuming excess energy, increased air flow can be detrimental in a semiconductor clean room. That is, currents of air within the clean room can stir up dust and other debris. Dust and debris can cause defects in the circuits printed on the semiconductor wafers.

Moreover, with the non-contacting conveyance equipment proposed in JP11-254369, the power of attracting and holding a conveyed object by causing a fluid to swirl can be improved because the feeding mouth, revolution room, and bell mouth of air allow free passage for the conveyed object, are complicated in structure and the equipment is costly to manufacture.

Moreover, since the equipment of JP11-254369 is structurally complicated, miniaturization is difficult, the action range of the equipment is limited, and the equipment is problematically inflexible.

Furthermore, owing to the complicated structure of a method using air, passage resistance becomes great. Therefore, in order to maintain sufficient attraction power, a lot of air needs to be deployed, thereby decreasing energy efficiency. Moreover, when a lot of air is circulated in a clean room, displaced dust becomes a problem.

SUMMARY OF THE INVENTION

The present invention is proposed in view of the above. The equipment of the present invention can be manufactured at a lower cost, can be easily miniaturized, and has an extended scope of use. Furthermore, the non-contacting conveyance equipment of the present invention can save energy.

The above-mentioned objectives can be attained by a non-contacting conveyance equipment comprising: a body having an end face that opposes an object to be conveyed, and a concave opening formed in the end face and surrounded by a cylindrical inner side wall; and a fluid passageway having a plurality of pairs of spouts to introduce fluid into an inner space of the concave opening in a circumferential direction of the cylindrical inner side wall so as to cause a swirl of fluid within the concave opening, each of the plurality of pairs of spouts being formed on the cylindrical inner side wall symmetrically to a central axis of the concave opening.

A plurality of the non-contacting conveyance equipments may be provided on a base. In this case fluid may swirl clockwise in at lease one of the plurality of fluid swirl formation objects, and fluid may swirl counterclockwise in at least one of the plurality of fluid swirl formation objects. The base may be surrounded with a peripheral edge to prevent fluid away from the base.

The base may have a center with a center swirl formation object formed substantially at the center of a base and a plurality of fluid swirl formation objects arranged around the center swirl formation object. The center swirl formation object is similar to the fluid swirl formation objects except that an inner wall may be formed within the concave opening of the center swirl formation object so as to form a channel between an outer surface of the inner wall and the inner peripheral surface of the concave opening.

The fluid supplied through the spout may be ionized. In addition, or as an alternative to ionization, the fluid may be air, which is vibrated at an ultrasonic frequency.

Centering protrusions may be radially displaced from a center of the non-contacting conveyance equipment. A centering mechanism may vary the radial distance of the centering protrusions from the center of the non-contacting conveyance equipment.

In this invention, a spout faces the inside of a concave opening to supply fluid to an inner peripheral surface. According to one aspect of the invention, this configuration allows objects to be conveyed using a smaller quantity of air than was previously possible. Accordingly, energy consumption is reduced. Perhaps more importantly, this aspect of the invention minimizes the air currents generated while conveying objects. If used in a semiconductor clean room, less dust and debris may be stirred up by the non-contacting conveyance equipment.

BRIEF DESCRIPTION OF THE DRAWINGS

The invention will be readily understood by reference to the following description of embodiments described by way of example only, with reference to the accompanying drawings in which like reference characters represent like elements, wherein:

FIG. 1A is a view from a slanting lower point, and FIG. 1B is a view from a slanting upper point.

FIG. 2A is a view taken through the I-I line of FIG. 1A, and FIG. 1B is a view taken through the II-II line of FIG. 1A.

FIG. 2A is a view from a slanting lower point, and FIG. 2B is a view from a slanting upper point.

FIG. 4A is a bottom view of FIG. 3A, and FIG. 4B is a view taken through the III-III line of FIG. 3B.

FIG. 9A is a top view, and FIG. 9B is a view taken through the V-V line of FIG. 9A.

DETAILED DESCRIPTION OF THE PREFERRED EMBODIMENTS

The present invention will now be described with reference to embodiments and examples, although the invention is not limited to these.

Figure 1A:
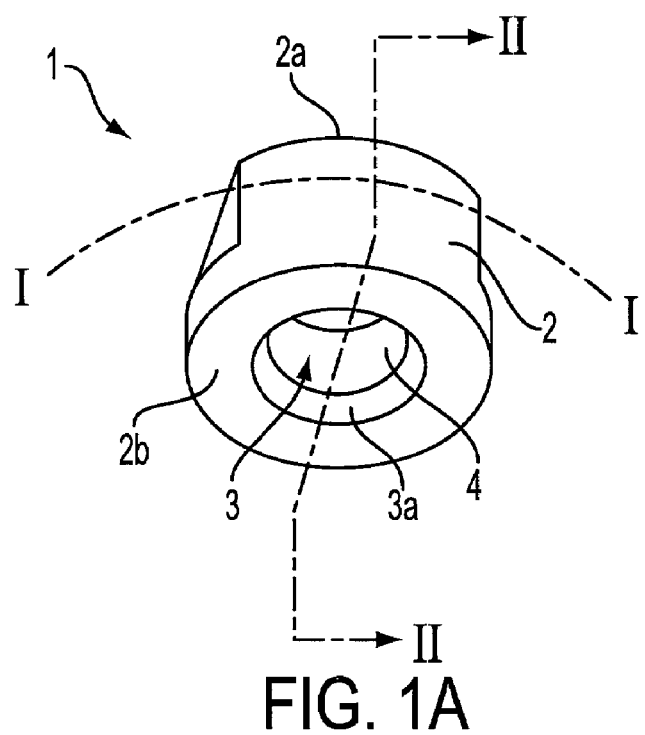
FIGS. 1A and 1B are perspective views of the first embodiment of non-contacting conveyance equipment, where
Figure 1B:
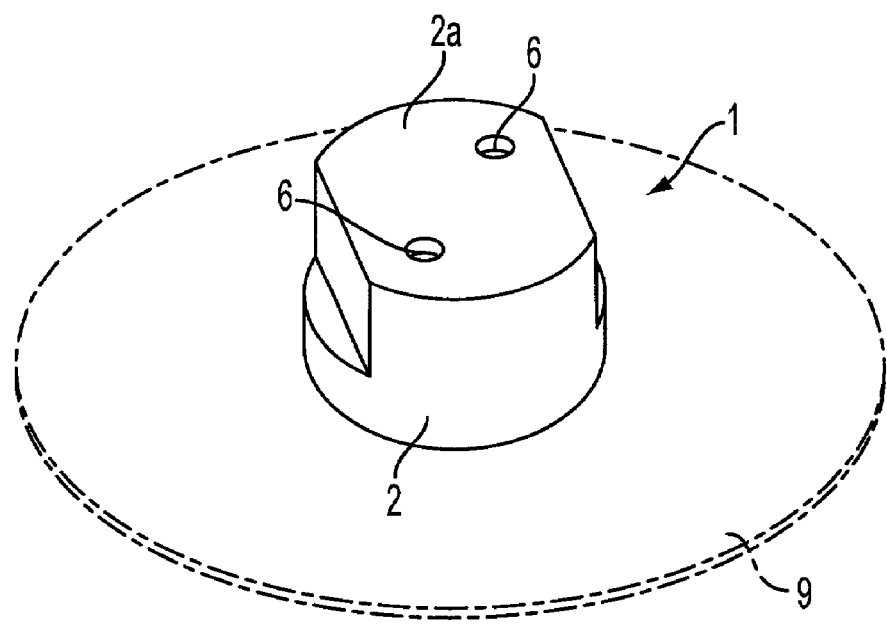
Figure 2A:
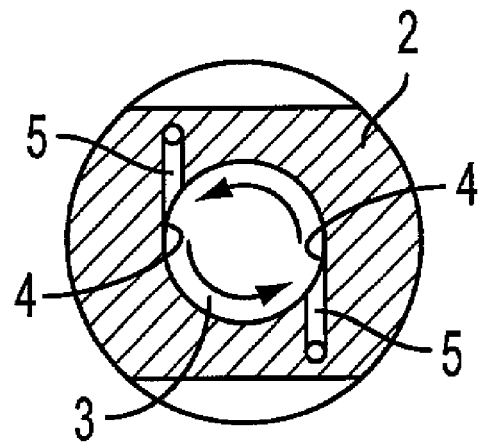
FIGS. 2A and 2B are cross sectional views of the non-contacting conveyance equipment shown in FIG. 1A, where
Figure 2B:
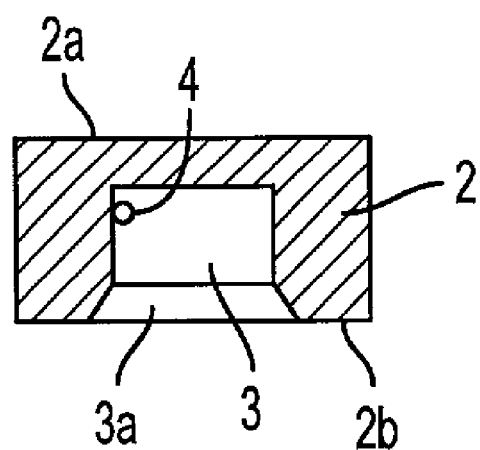

FIGS. 1A and 1B are perspective views of the first embodiment of non-contacting conveyance equipment, where FIG. 1A is a view from a slanting lower point, and FIG. 1B is a view from a slanting upper point. FIGS. 2A and 2B are cross sectional views of the non-contacting conveyance equipment shown in FIG. 1A, where FIG. 2A is a view taken through the I-I line of FIG. 1A, and FIG. 1B is a view taken through the II-II line of FIG. 1A. In these views, the non-contacting conveyance equipment 1 of the present invention is equipment which holds and conveys an object (here wafer 9) by non-contacting. Moreover, this equipment is constructed using a pillar-shaped fluid swirl formation object 2. The non-contacting conveyance equipment 1 of the present invention is equipped inside with the circumference-like concave part 3. In equipment 1, flat-end-face 2b is provided at the opening side of concave part 3, and supports the object non-contactingly. A fluid passage 5 supplies fluid to a spout 4, which faces the inside of concave part 3 and breathes the fluid out along a direction tangential to an inner circumference of concave part 3 and into concave part 3.

A fluid introduction mouth 6 is prepared in a closed-face 2a of fluid swirl formation object 2 by drilling perpendicular to closed-face 2a until reaching fluid passage 5, which is drilled horizontally to reach spout 4, which faces the inside of concave part 3. That is, fluid passage 5 provides free passage from fluid introduction mouth 6 to spout 4, and causes supply fluid to breathe out along the direction tangential to the inner circumference of concave part 3 and into concave part 3 from spout 4. By this arrangement, fluid is supplied such that a fluid swirl occurs inside the concave part 3.

Fluid introduction mouth 6, fluid passage 5, and a set of two spouts 4 are formed, and the fluid (here air) which blows off from the set of two spouts 4 is breathed out in the same direction in a circumferential direction, and thereby the spouts mutually create a fluid swirl of slight strength.

Moreover, slope 3a is formed by chamfering and the diameter of the opening edge of the concave part 3 is expanded in the shape of a trumpet. Therefore, the fluid swirl generated in concave part 3 can flow swiftly out of concave part 3 via this slope 3a.

In the non-contacting conveyance equipment 1 of the above-mentioned construction, if air is supplied to fluid introduction mouth 6 from air supply equipment (not shown), the air will be blown into concave part 3 from spout 4 through fluid passage 5. The air becomes a fluid swirl, and is resupplied in the internal space of concave part 3. The resupplied swirling air then flows out of concave part 3. If wafer 9 is arranged in a position counter to flat-end-face 2b of fluid swirl formation object 2, then at the time of the outflow, since air will flow out at high-speed along with flat-end-face 2b, negative pressure occurs between flat-end-face 2b and wafer 9. Therefore, wafer 9 is pushed by surrounding atmospheric pressure, and is attracted to flat-end-face 2b side. The air between flat-end-face 2b and wafer 9 is restored, and wafer 9 comes to be held in balance counter to flat-end face 2b and by non-contacting.

Thus, in the first embodiment of the present invention, wafer 9 is held with fluid swirl formation object 2, simply formed with concave part 3, flat-face 2b, and fluid passage 5. The equipment can be easily constructed, and the cost of manufacturing the equipment can be greatly reduced.

Moreover, since the equipment can be easily constructed, it can also be easily miniaturized. When miniaturized, the equipment can be inserted in previously unconventional spaces, its range of action may be extended, and its conveyance movement in a narrow domain within the same process and processing equipment can be performed more freely.

Moreover, since the fluid is resupplied in accordance with an interior that allows the fluid to be blown into concave part 3, a fluid swirl is created; the fluid swirls smoothly, and with reduced passage resistance. Therefore, energy efficiency is raised and energy use is curtailed.

Furthermore, the equipment blows fluid off in a circumferential direction in the concave part 3. Since this generates a fluid swirl, the attracting power of the negative pressure between flat-face 2b and the wafer 9 is markedly improved as compared with the conventional method, and becomes powerful.

In addition, although the above embodiment describes two sets of devices (a fluid introduction mouth 6, a fluid passage 5, and a spout 4), one such set is sufficient, and three or more sets may also be used.

Moreover, although fluid introduction mouth 6 is provided for each set of devices, one fluid introduction mouth 6 may feed plural elements. That is, one fluid introduction mouth may branch off to supply a plurality of fluid passages 5 and plural spouts 4.

Furthermore, although fluid passage 5 was formed in the combination of a vertical course and a horizontal course, it is not limited to such courses. It is only necessary to form fluid passage 5 so that air may be spouted in a circumferential direction in concave part 3 from fluid introduction mouth 6.

Next, a second embodiment of the non-contacting conveyance equipment of the present invention is explained, with reference to FIGS. 3 and 4. Some of the equipment of the first embodiment, described above, is used in this second embodiment, the same reference numerals are given to the same elements, and duplicate explanations are omitted.

Figure 3A:
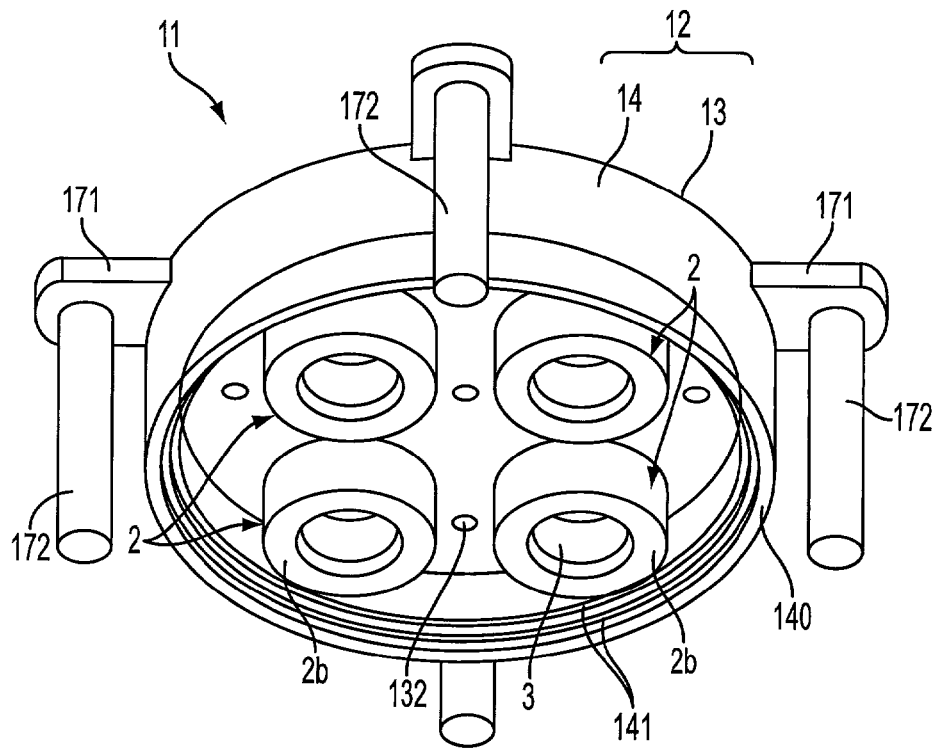
FIGS. 3A and 3B are perspective views of the second embodiment of non-contacting conveyance equipment, where
Figure 3B:
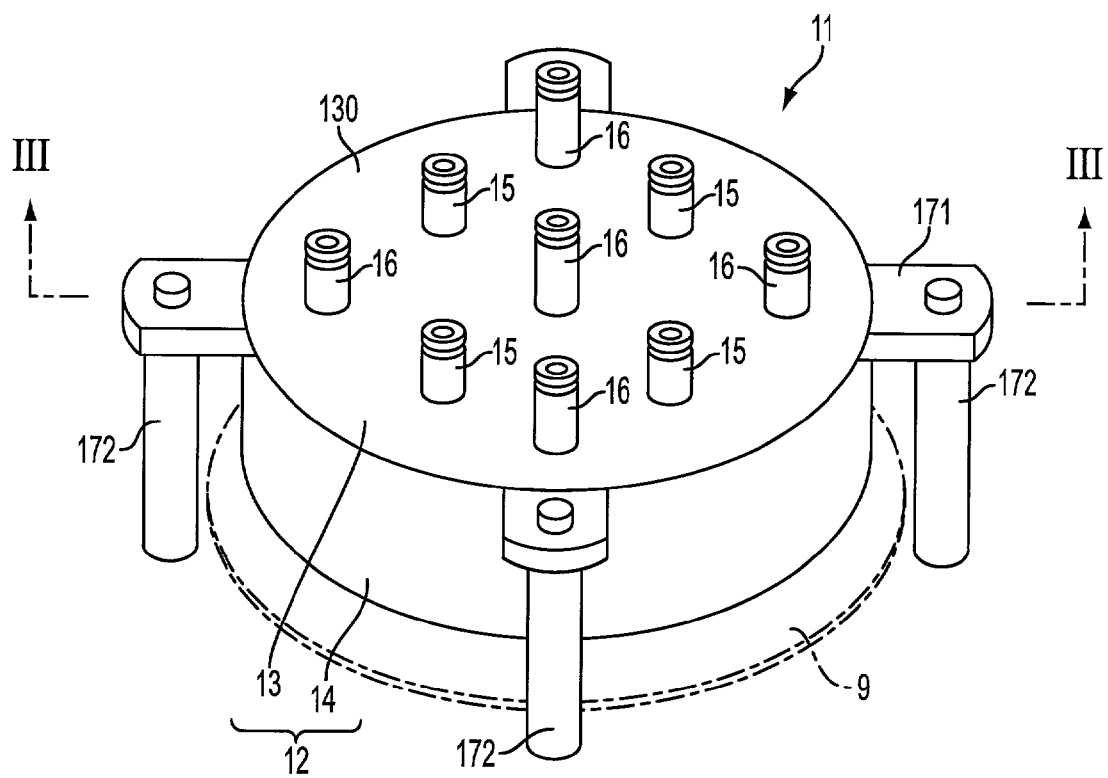
Figure 4A:
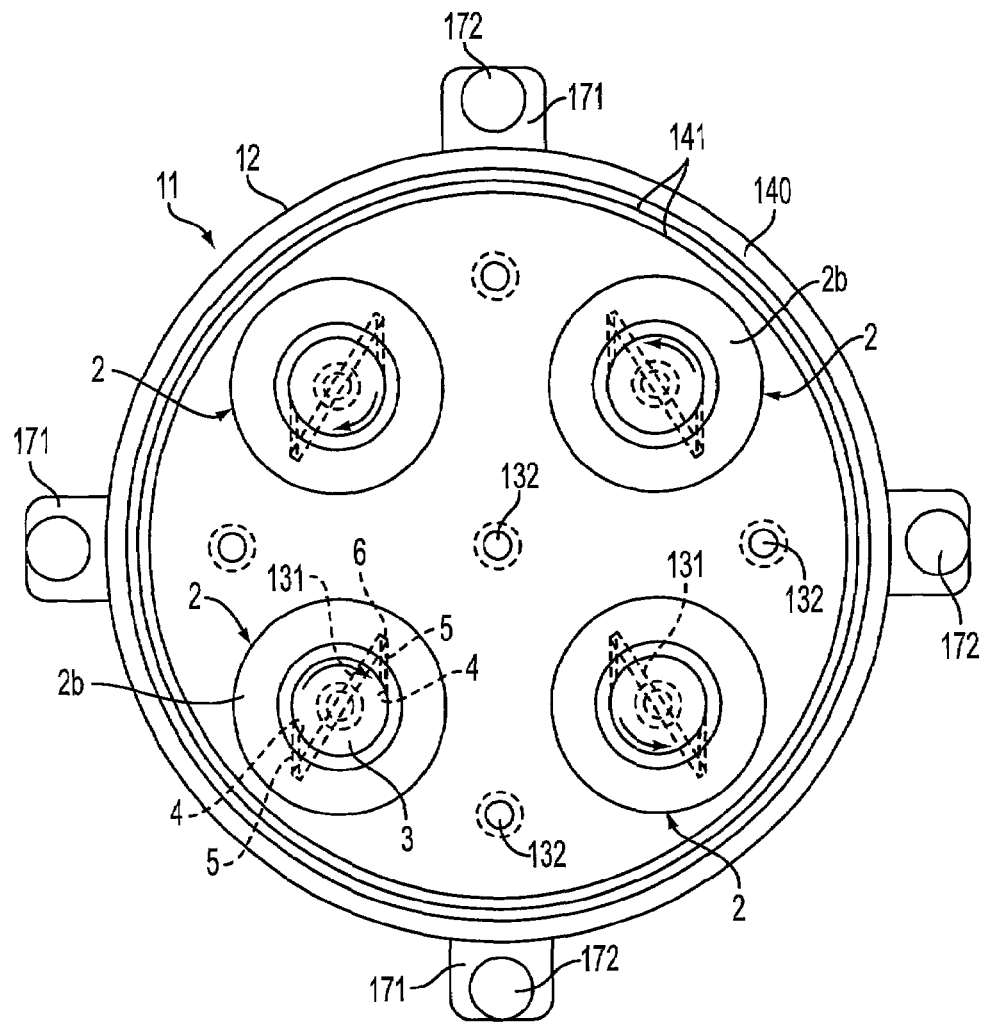
FIGS. 4A and 4B are views of the non-contacting conveyance equipment shown in FIGS. 3A and 3B, where
Figure 4B:
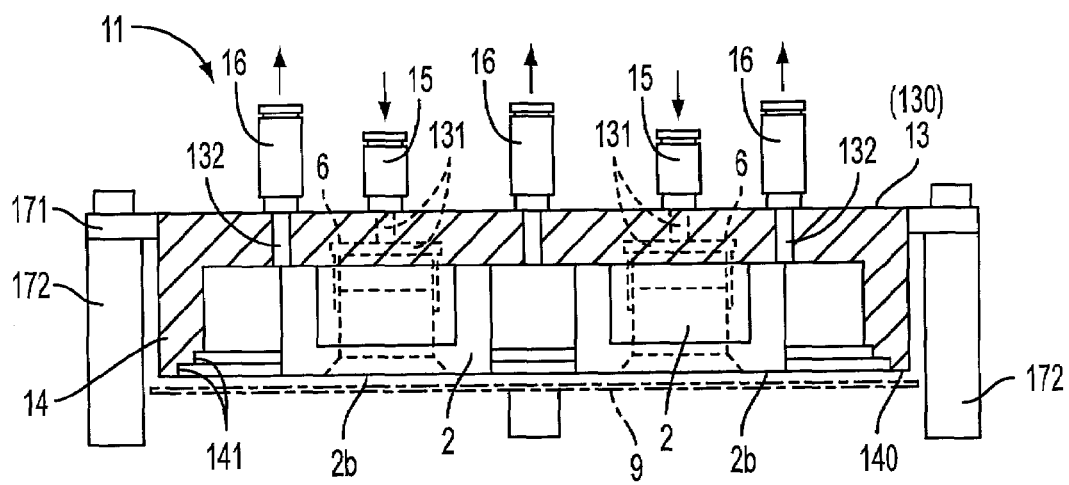

FIGS. 3A and 3B are perspective views of the second embodiment of non-contacting conveyance equipment, where FIG. 2A is a view from a slanting lower point, and FIG. 2B is a view from a slanting upper point. FIGS. 4A and 4B are views of the non-contacting conveyance equipment shown in FIGS. 3A and 3B, where FIG. 4A is a bottom view of FIG. 3A, and FIG. 4B is a view taken through the III-III line of FIG. 3B.

Two or more fluid swirl formation objects 2, as explained in the first embodiment, are used in the non-contacting conveyance equipment 11 of the second embodiment. Non-contacting conveyance equipment 11 is equipped with a support object 12 comprised of a peripheral surface 14 installed in a base 13 and at the perimeter of base 13. Four fluid swirl formation objects 2 are attached in base 13 of support object 12.

Each of the four fluid swirl formation objects 2 is attached in the inside (base field) of the base 13 by their closed-face sides 2a. Moreover, they are supported so that their flat-end-faces 2b mutually form a same side. The height of peripheral surface 14 is adjusted so that its end face 140 also forms the side mutually formed by flat-end-faces 2b. Furthermore, a chamber fin 141 is formed in the shape of two steps in a part of the inner periphery of an end face 140 of peripheral surface 14.

Corresponding to each of the fluid swirl formation objects 2, a fluid supply mouth 15 is formed in an external surface 130 of the base 13. A base passageway 131, to which each of the fluid supply mouths 15 and two fluid introduction mouths 6 of the corresponding fluid swirl formation object 2 is connected is branched and formed in the wall inside of the body part of base 13 from fluid supply mouth 15 (FIG. 4 (b)).

A supply mouth 15 in base 13 connects to base passageway 131 that is formed in the wall of base 13, and branches out to connect to fluid introduction mouths 6.

Five fluid outlets 16, other than the four above-mentioned fluid supply mouths 15, are formed in external surface 130 of base 13. Discharge passages 132, which lead to each of fluid outlets 16, are installed through the wall inside of the body part of base 13, and connect fluid outlets 16 to support object 12.

Furthermore, attachment piece 171 is protruded on four places at predetermined intervals at peripheral surface 14 of support object 12. Nearly cylindrical lateral movement prevention guides 172 are installed in an attachment piece 171. The end sides of these lateral movement prevention guides 172 are projected to the plane mutually formed by end face 140 of peripheral surface 14, and each flat-end-face 2b.

In the non-contacting conveyance equipment 11 of the above-mentioned construction, if the air from air supply equipment (not shown) is sent to fluid supply mouth 15, the air will be blown into concave part 3 from spout 4 through base passageway 131, fluid introduction mouth 6, and fluid passage 5. The air becomes a fluid swirl, and is resupplied in the internal space of concave part 3, and the air then flows out of concave part 3. When the fluid swirls hold wafer 9 by non-contacting, the rotational direction of the fluid swirls are beforehand mutually adjusted so that wafer 9 does not rotate. For example, as shown in FIG. 4A, by arrangement of the spouts 4, the fluid swirls clockwise in two of the fluid swirl formation objects 2, and counterclockwise in the other two fluid swirl formation objects 2.

As in the case of the above-mentioned first embodiment, if wafer 9 is arranged in a position counter to flat-faces 2b of fluid swirl formation objects 2 at the time of the outflow of each fluid swirl, wafer 9 will be held by non-contacting in response to the attracting power of the negative pressure created by the restitution of the air flow where flat-face 2b is countered. Movement of wafer 9 is also guided and prevented by lateral movement prevention guides 172, which are particularly useful if wafer 9 moves when support object 12 is moved during manufacturing. That is, non-contacting conveyance equipment 11 holds and conveys wafer 9 by non-contacting.

Airflow passing though flat-end-face 2b from concave part 3b goes into the internal space of support object 12. It passes along discharge passage 132 and fluid outlet 16, after which it is compulsorily discharged via the exhaust (not shown).

Moreover, the flow that reaches peripheral surface 14 is disturbed and resisted by chamber fin 141 of peripheral surface 14. For this reason, less air escapes over end face 140 of the peripheral surface 14, and outflow is decreased. Therefore, most air flow stays in the internal space and discharges by passing along discharge passage 132 and out of fluid outlets 16.

Moreover, lateral movement prevention guides 172 are formed outside of peripheral surface 14. If wafer 9 held by non-contacting tends to move or deviate horizontally, this movement is prevented, and wafer 9 is stabilized during conveyance by lateral movement prevention guides 172.

FIG. 3 shows the second embodiment of the present invention, which may be constructed using the easily constructed fluid swirl formation objects 2 of the first above-mentioned embodiment.

For this reason, the embodiment also may realize the benefits of miniaturization and energy savings. Moreover, since it is made to attract wafer 9 by the fluid swirl formed in concave part 3, the attracting power can be made markedly improved.

Moreover, since it may be caused to generate the fluid swirls in four places, the whole of wafer 9 may be more powerfully attracted. Therefore, it becomes possible to correct curvature over the whole wafer 9, and the curvature reform power also becomes powerful. Consequently, when wafer 9 is large, and even in the case where it is curved, the wafer can be reliably held by non-contacting, and where conveyance is also stabilized, it can carry wafer 9 with greater certainty.

Moreover, each fluid swirl formation object 2 has a simple construction that blows air into concave part 3 and forms a fluid swirl directly. For this reason, a stable fluid swirl with non-contacting maintenance power is used. Four fluid swirl formation objects 2 become uniform with each other, and non-contacting maintenance of wafer 9, which formerly tended to become a little unstable, can be performed with sufficient stability.

Furthermore, due to the power of non-contacting maintenance, if the whole non-contacting conveyance equipment 11 reverses direction, a reliable state of maintenance is attained. Moreover, wafer 9 can be reversed with the non-contacting conveyance equipment and can be conveyed to a subsequent processing stage.

In addition, although the construction of this second embodiment establishes four fluid swirl formation objects 2, it is not so limited, and arbitrary numbers of fluid swirl formation objects 2 may be used.

Moreover, although chamber fin 141 of peripheral surface 14 was made into the shape of stairs, it is only necessary that the structure increase air resistance. A slot form, for example, also works to increase air resistance.

Furthermore, fluid supply mouth 15 and fluid outlets 16 may be prepared in arbitrary numbers. However, at least three lateral movement prevention guides 172 need to be prepared.

Figure 5:
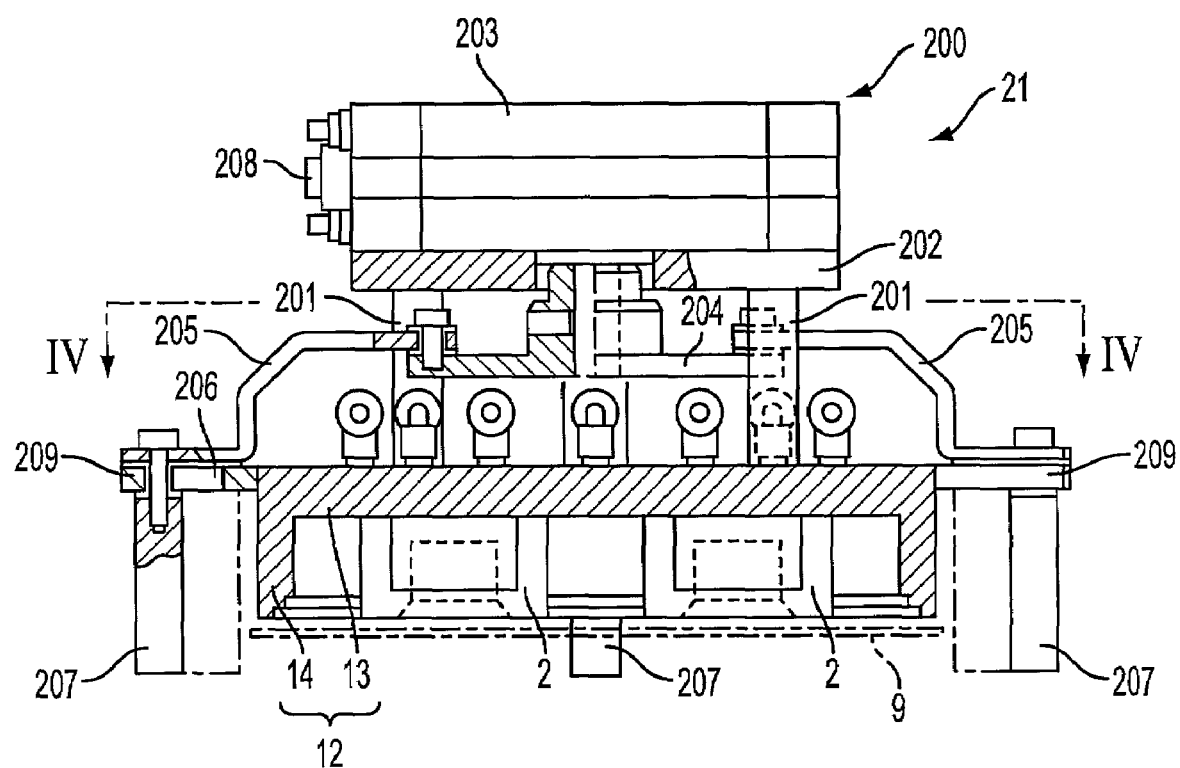
FIG. 5 is a cross sectional side view of the third embodiment of non-contacting conveyance equipment.
Figure 6:
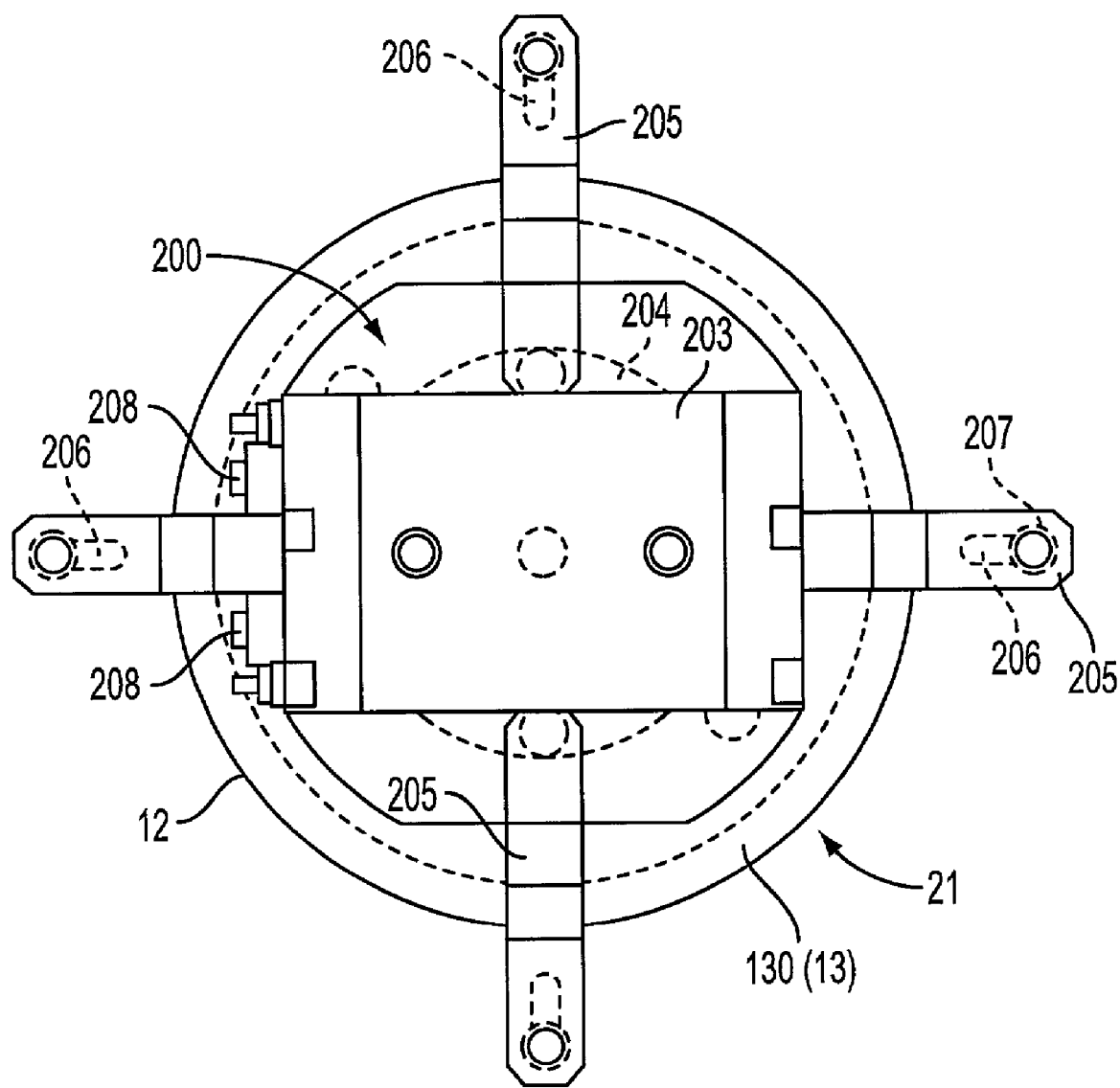
FIG. 6 is a top view of the third embodiment of non-contacting conveyance equipment.
Figure 7A:
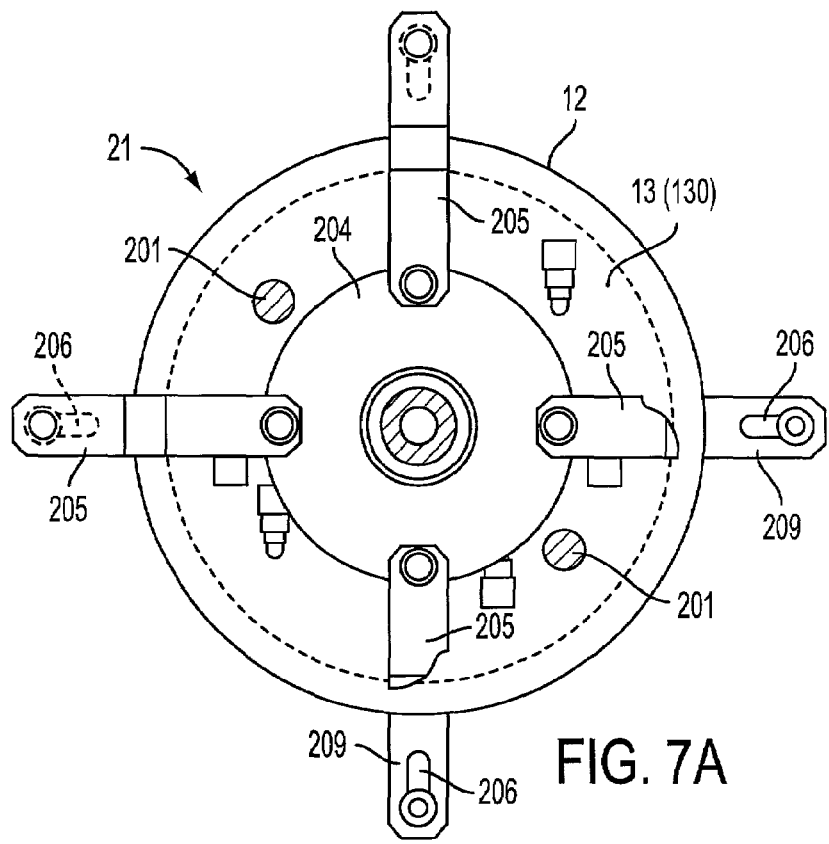
FIG. 7 is an action diagram of the centering mechanism, viewed through the IV-IV line of FIG. 5.
Figure 7B:
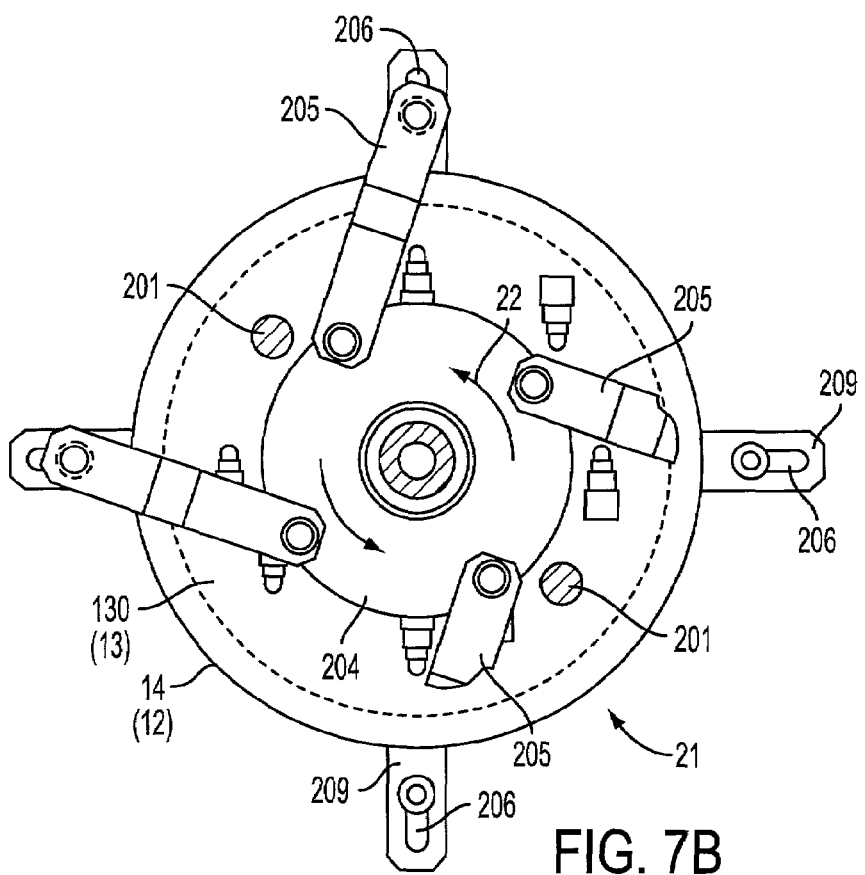

Next, the third embodiment of the non-contacting conveyance equipment of the present invention is explained using FIG. 5, FIG. 6, and FIG. 7.

FIG. 5 is a cross sectional side view of the third embodiment of non-contacting conveyance equipment.

FIG. 6 is a top view of the third embodiment of non-contacting conveyance equipment.

FIG. 7 is an action diagram of the centering mechanism, viewed through the IV-IV line of FIG. 5.

The non-contacting conveyance equipment 21 of this third embodiment differs from the above-mentioned non-contacting conveyance equipment 11 of the second embodiment in that it is formed with a centering mechanism 200, for positioning a wafer 9, and for preventing lateral movement of wafer 9 which is held by non-contacting.

Centering mechanism 200 is equipped with a rotary actuator 203 fixed on a base board 202 supported with a support 201 set up on an external surface 130 of base 13. Moreover, centering mechanism 200 is equipped with link arms 205, prepared toward the quarters of a perimeter edge of a flange 204, which is attached to a shaft (not shown) of rotary actuator 203. Each of the link arms 205 has an uneven, long, and slender board material, one end of which is installed in the perimeter edge of flange 204, and other end of which is level. Moreover, a slot 206 for a guide is established in an attachment piece 209, which protrudes in a direction away from external surface 130. A bolt is inserted in slot 206, and attachment piece 209 is established in the other end of link arm 205. A centering guide (arm for centering) 207 can be screwed on and installed in the bolt, and centering guide 207 can be slid along slot 206 for a guide.

Centering mechanism 200 of non-contacting conveyance equipment 21, constructed as above, operates as follows. First, air is sent into an air drive insertion mouth 208 of rotary actuator 203, setting into operation rotary actuator 203. According to the operation, flange 204 rotates through a predetermined angle, in the direction shown by the arrow 22 in FIG. 7(a) of actuator 203, from the state of FIG. 7(a), to the state of FIG. 7(b); each link arm 205 moves according to the rotation. At this time, centering guide 207, installed at the other end of link arm 205, is guided in slot 206 as a guide of the attachment piece 209, and performs straight movement. Link arms 205 move only a predetermined distance in the direction of the center of base 13, and then stop. Wafer 9, currently held by non-contacting conveyance equipment 21, is regulated at the four quarters of the perimeter by lateral movement in a direction of the center of centering guide 207. By such movement, the center of wafer 9 comes to be positioned in alignment with the center of the internal space of support object 12. On the other hand, regulation of wafer 9 may be cancelled by rotating flange 204 in an opposite direction to that shown by arrow 22. Thereby, centering guide 207 moves in the direction that separates from the center of base 13, and wafer 9 held by non-contacting, is free to move laterally.

According to the operation of rotary actuator 203, centering guide 207 isolates or approaches only the same distance to peripheral surface 14, respectively. And while holding wafer 9 by non-contacting on the inner side, wafer 9 is positioned with high precision. Therefore, when conveying wafer 9 and arranging it in a predetermined position, it may be arranged with high precision. Therefore, wafer 9 may be processed smoothly and accurately.

Next, the fourth embodiment of the non-contacting conveyance equipment of the present invention is explained with reference to FIGS. 8 and 9.

Figure 8:
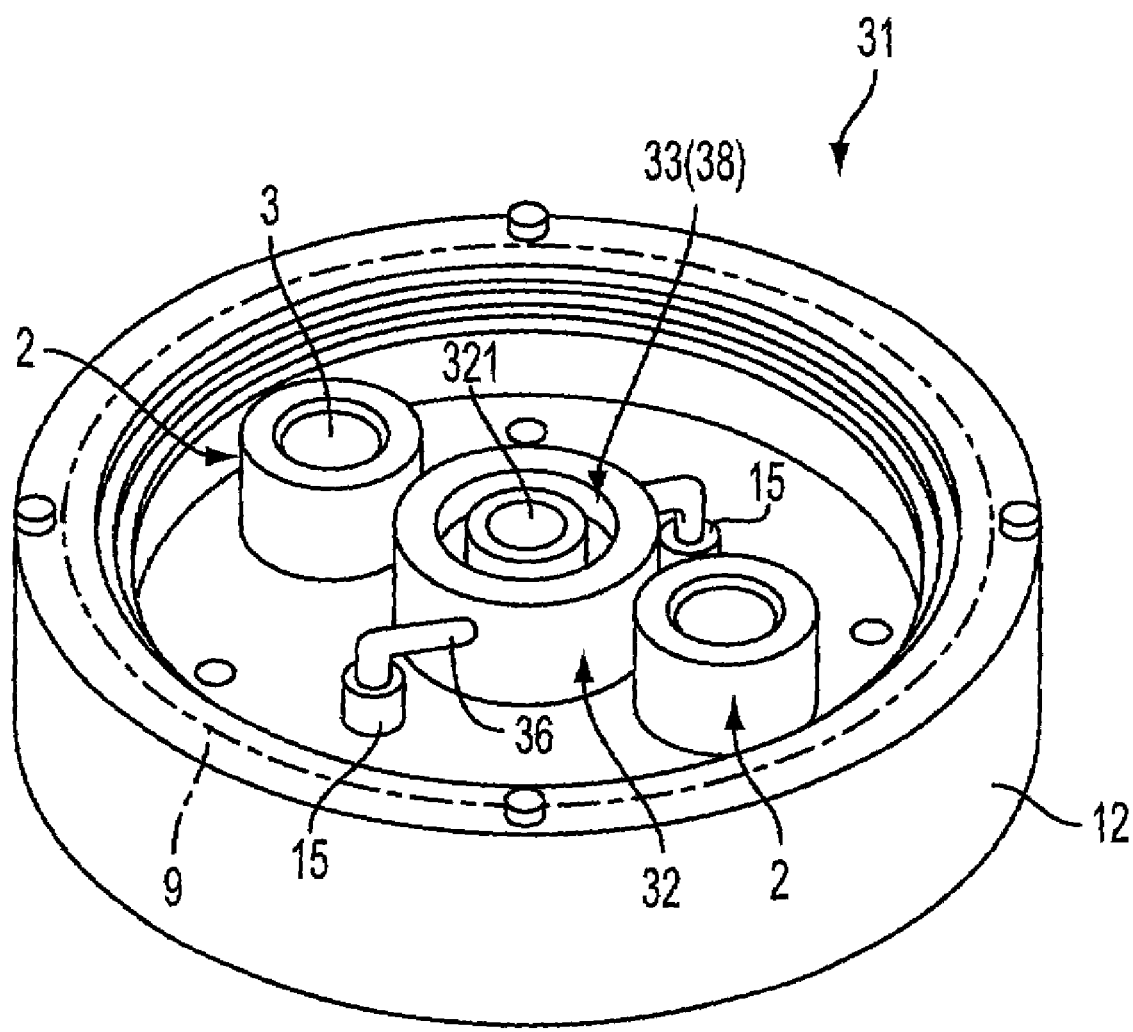
FIG. 8 is a perspective view, from a slanting upper point, of the fourth embodiment of non-contacting conveyance equipment.
Figure 9A:
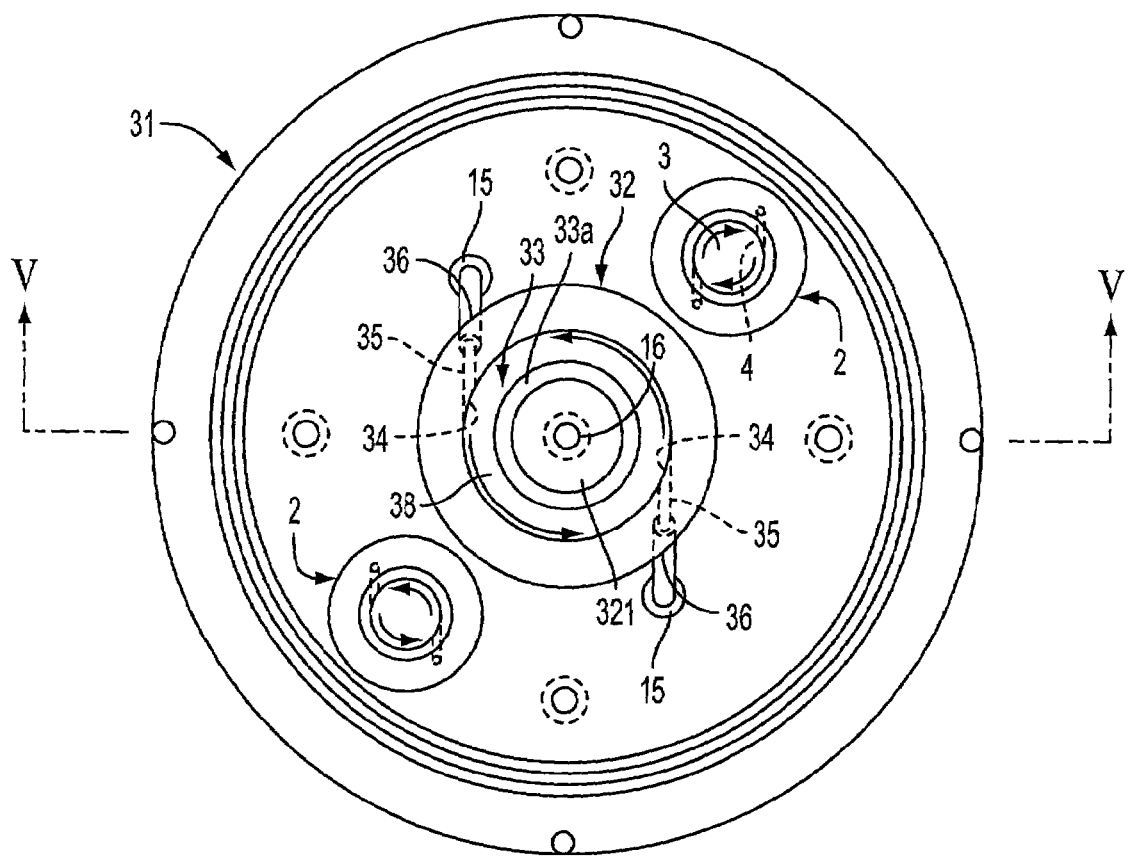
FIGS. 9A and 9B are views of the non-contacting conveyance equipment shown in FIG. 8, where
Figure 9B:
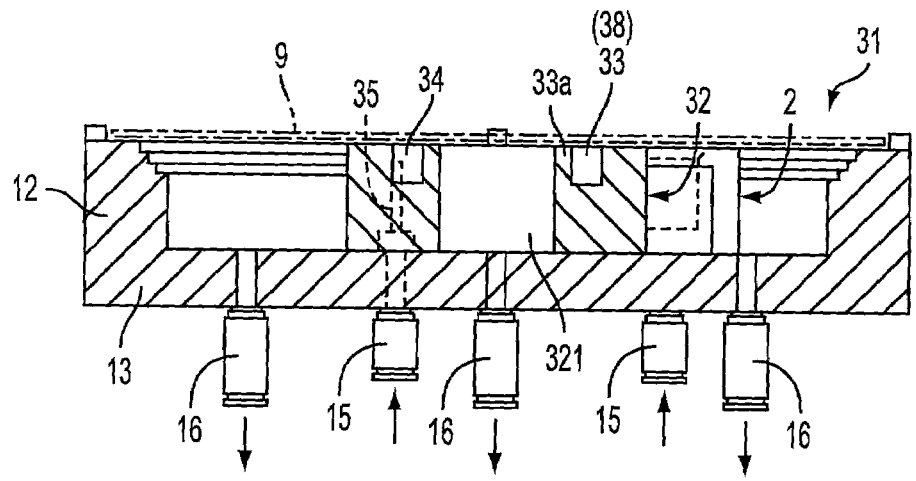

FIG. 8 is a perspective view, from a slanting upper point, of the fourth embodiment of non-contacting conveyance equipment. FIGS. 9A and 9B are views of the non-contacting conveyance equipment shown in FIG. 8, where FIG. 9A is a top view, and FIG. 9B is a view taken through the V-V line of a FIG. 9A.

In the non-contacting conveyance equipment 31 of the fourth embodiment, a fluid swirl formation object 32 at the center of equipment 31, and the fluid swirl formation objects 2 at the circumference of the equipment 31 are constructed differently. Two fluid swirl formation objects 2, arranged at the circumference of the equipment 31, have the same construction as used in the first, second, and third embodiments. However, the fluid swirl formation object 32 arranged at the center of equipment 31 has the following construction.

Inside concave part 33 of fluid swirl object 32, a peripheral-wall 33a is prepared, forming a swirl passage 38, and a central hole 321. Moreover, a fluid introduction mouth 36 is formed so that the perimeter side of the fluid swirl formation object 32 may be faced. A fluid passage 35 is horizontally drilled in a thick part of the inside of fluid swirl formation object 32, from fluid introduction mouth 36, and reaching spout 34 so that fluid swirl passage 38 is accessed. Air is breathed out, along the direction of a circumference of fluid passage 38, into fluid swirl passage 38 from spout 34, and, swirling around at and in fluid swirl passage 38, the air serves as a fluid swirl. Fluid introduction mouth 36, fluid passage 35, and a set of two spouts 34 are formed. The air which blows off from each of the spouts 34 is breathed out in a circumferential direction, and mutually forms a fluid swirl of slight strength.

Moreover, as shown in a FIG. 9 (b), fluid supply mouths 15 prepared in base 13 correspondingly join to the two fluid introduction mouths 36 of fluid swirl formation object 32 located at the center. Moreover, one piece is prepared at a time in each of the fluid swirl formation objects 2 located towards the circumference as in the second embodiment.

Each of the fluid swirl formation objects 2 located towards the circumference is constructed so that their swirls rotate in mutually reverse directions.

In this fourth embodiment, wafer 9 is held by non-contacting by the fluid swirl generated with fluid swirl formation objects 2 and 32. This effects the same peculiar action demonstrated in the embodiments above.

That is, since fluid swirl passage 38 was established in the center of fluid swirl formation object 32, the air which flows in fluid swirl passage 38 serves as a high-speed fluid swirl. Therefore, the fluid swirls being further resupplied, wafer 9, currently held by non-contacting, is rotated with strengthened torque and wafer 9 rotates at high speed, to an extent not possible with a conventional non-contacting equipment. Equipment that carries out centrifugal separation and dries moisture adhered to wafer 9 during a washing process, can be constructed using fluid swirl formation object 32 to rotate wafer 9 at high speed. Moreover, it can also serve as a washing machine that, by non-contacting, dries off and washes foreign substances adhering to wafer 9, without cracking wafer 9. Moreover, the rotation drive when detecting the orientation flat and V notch of the wafer, the rotation drive at the time of appearance inspection of the wafer, the rotation drive at the time of wafer etching, etc., can use it.

The direction and intensity of the fluid swirl in the fluid swirl formation objects 2 are both controlled by the amount of supplied air. By such control, the high-speed rotation of wafer 9 by central fluid swirl formation object 32 is controllable at a proper rotation speed. Therefore, equipment 16 of the fourth embodiment can be appropriately used as a drier or as a washing machine.

Figure 10:
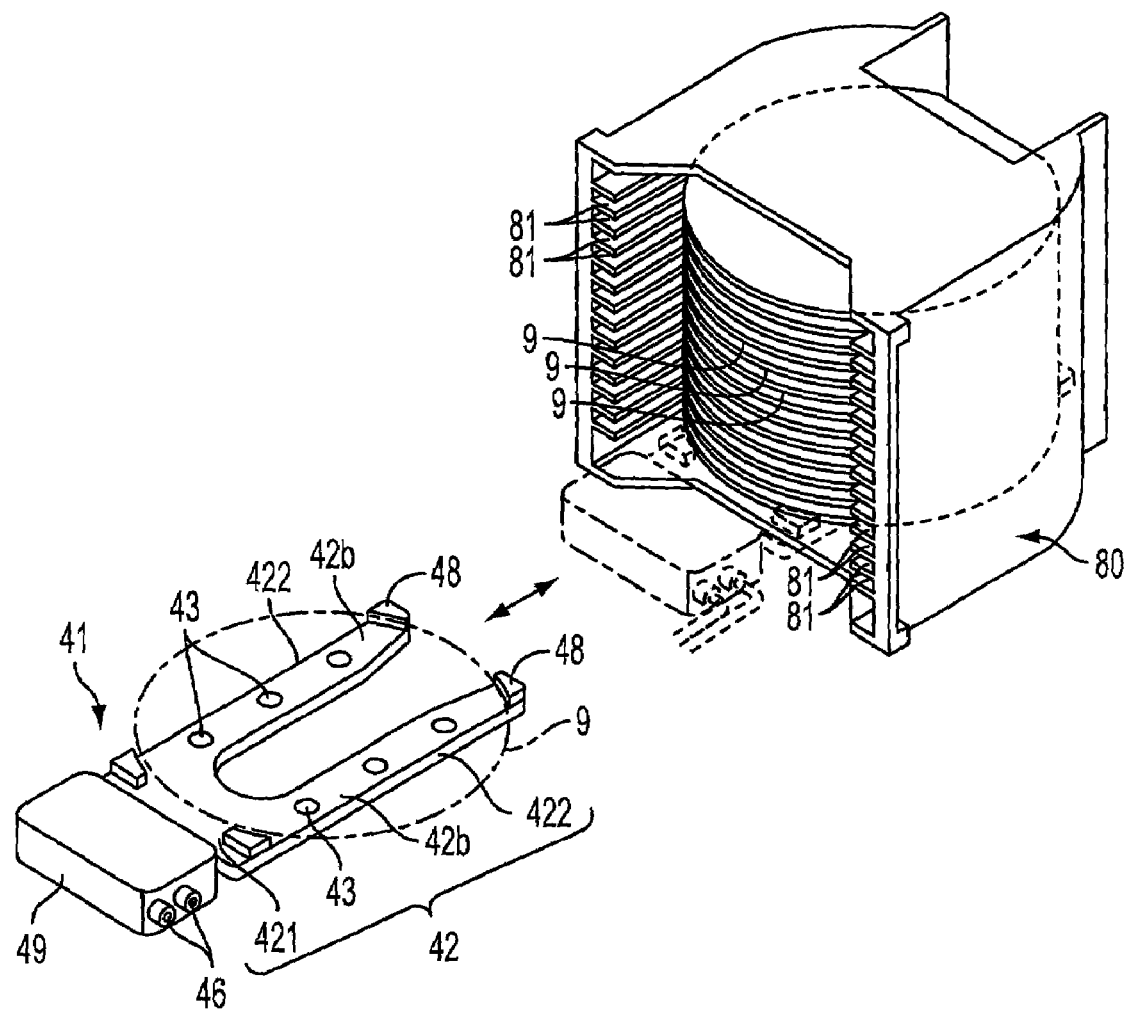
FIG. 10 is a perspective view of the fifth embodiment of non-contacting conveyance equipment, shown individually with solid lines, and shown with dotted lines as inserted into a wafer cassette.
Figure 11:
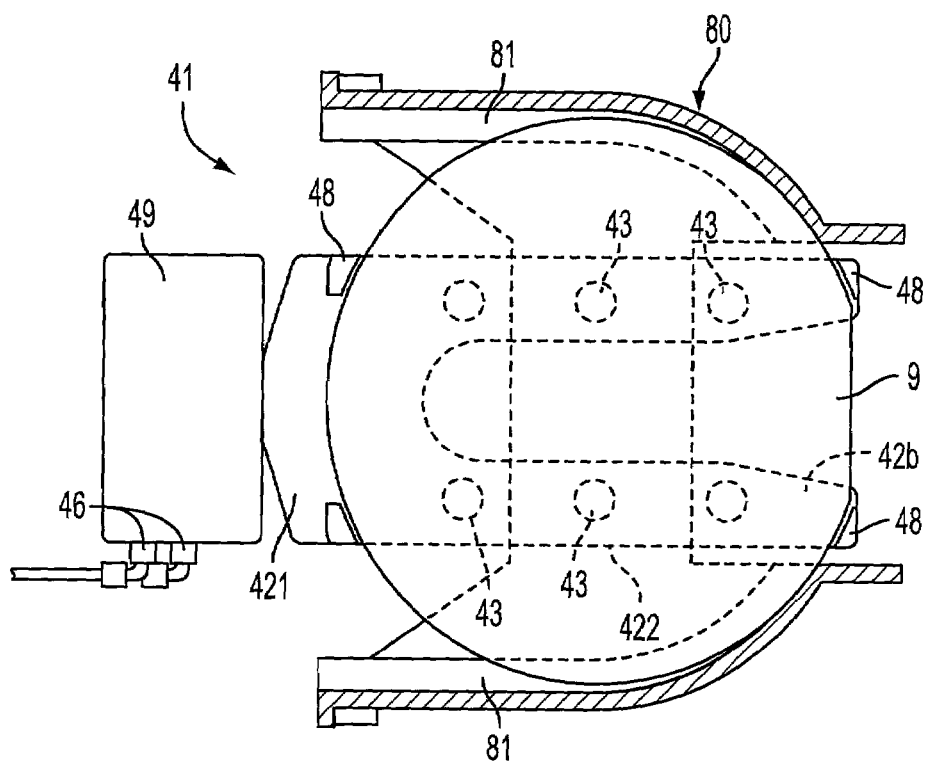
FIG. 11 is a top view of the non-contacting conveyance equipment shown in FIG. 10, inserted in the wafer cassette.
Figure 12:
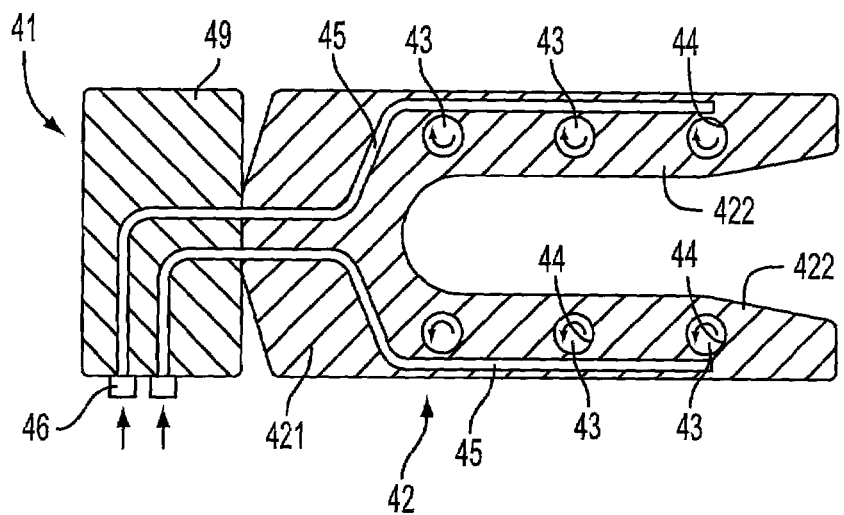
FIG. 12 is a horizontal sectional view of the non-contacting conveyance equipment shown in FIGS. 10 and 11.

Next, the fifth embodiment of the non-contacting conveyance equipment of the present invention is explained using FIGS. 10, 11, and 12.

FIG. 10 is a perspective view of the fifth embodiment of non-contacting conveyance equipment, shown individually with solid lines, and shown with dotted lines where inserted into a wafer cassette. FIG. 11 is a top view of the non-contacting conveyance equipment, shown in FIG. 10, inserted in the wafer cassette. FIG. 12 is a horizontal sectional view of the non-contacting conveyance equipment shown in FIGS. 10 and 11. Circumference-like concave parts 43 are inside the board-like base 42, which has a flat side 42b, in which non-contacting conveyance equipment 41 counters wafer 9 in these figures. Fluid passages 45, which make air breathe out along the direction of an inner circumference of the concave parts 43, are formed into concave parts 43, and consist of spouts 44 which face the insides of concave parts 43.

The board-like base 42 consists of a base part 421 and two arm parts 422, which branch from base part 421, forming two prongs of a fork. A grasping part 49, for enabling movement of the base 42, adheres to the end side of base 421. Concave parts 43 are located in a line along each of arm parts 422; three concave parts 43 to one arm part 422. Moreover, an E-like movement prevention guide 48 is formed in one of the concave parts 43 to an arm part 422.

As shown in FIG. 12, the fluid passages, installed in the two arm parts 422, pass to two fluid introduction mouths 46, which open to the side of grasping part 49. Fluid passages 45 branch to spouts 44 which attend concave parts 43.

In the non-contacting conveyance equipment 41 of the above-mentioned construction, if the air from air supply equipment (not shown) is sent to fluid introduction mouth 46, the air will be blown into each of concave parts 43 from spouts 44 through fluid passages 45. The air becomes a fluid swirl, and is resupplied in the internal spaces of concave parts 43, after which the air flows out of concave parts 43. The direction of each of the fluid swirls, holding the wafer 9 by non-contacting, may be mutually adjusted beforehand so that wafer 9 does not rotate. For example, as shown in FIG. 12, the three concave parts 43 of one arm part 422 are adjusted to swirl clockwise by changing the arrangement of spouts 44, at three concave parts 43; the fluid swirls of the other arm part 422 are similarly arranged to swirl counterclockwise.

As is the case with each of the above-mentioned embodiments, when wafer 9 is arranged in a position counter to the flat side 42b of base 42, the outflow of each fluid swirl holds wafer 9 in balance by the negative pressure created by the outflow of the fluid swirls, and by resupplying of the air flow by non-contacting, where flat side 42b is counter to the wafer. If grasping part 49 is held in the state of maintenance, and board-like base 42 is moved, wafer 9 will move with it, and wafer 9 will be guided by movement prevention guide 48. That is, non-contacting conveyance equipment 41 holds and conveys wafer 9 by non-contacting.

Since base 42 of this non-contacting conveyance equipment 41 is thinly constructed in the shape of a board, as shown in FIGS. 10 and 11, the board may be inserted into a narrow opening in a stack of wafers 9, which adjoin each other by the upper and lower sides, and which are held on shelves 81 of a wafer cassette 80.

Thus, in the fifth embodiment of the present invention, since it is made to attract wafer 9 by the fluid swirls formed in each of concave parts 43, as in the case of each of the above-mentioned embodiments, the power of attraction can be made powerful with a board-like base 42 holding the wafer fully secured. Therefore, non-contacting conveyance equipment 41 can be constructed in the shape of a board, capable of smoothly and freely accessing and retrieving wafers stacked in a wafer cassette 80, which is conventionally difficult to access. Moreover, in a case where wafer cassette 80 is contained and loaded with the wafer, it can timely carry a wafer to a desired position. That is, taking a wafer from wafer cassette 80 and carrying in to wafer cassette 80 can be performed freely, thereby sharply increasing the working efficiency.

Furthermore, since the fluid swirls are formed at two or more places, and since the non-contacting maintenance power is powerful, even a wafer 9 that has curvature may be held in a state of non-contacting maintenance where its curvature is corrected. Moreover, even if the whole non-contacting conveyance equipment 41 is reversed, the maintenance state can be maintained, wafer 9 is also reversed, and wafer cassette 80 can also be loaded, reversed, and conveyed to a subsequent processing stage.

In addition, although in the explanation above board-like base 42 was constructed with two forks and so considered, and although the construction put three concave parts 43 in order at a time, these modes of construction are arbitrary and should be constructed depending on their use. For example, one arm instead of two forks may be considered, and an arm may be constructed with only one concave part 43. Moreover, grasping part 49, although formed in this embodiment, is formed only if needed.

Figure 13:
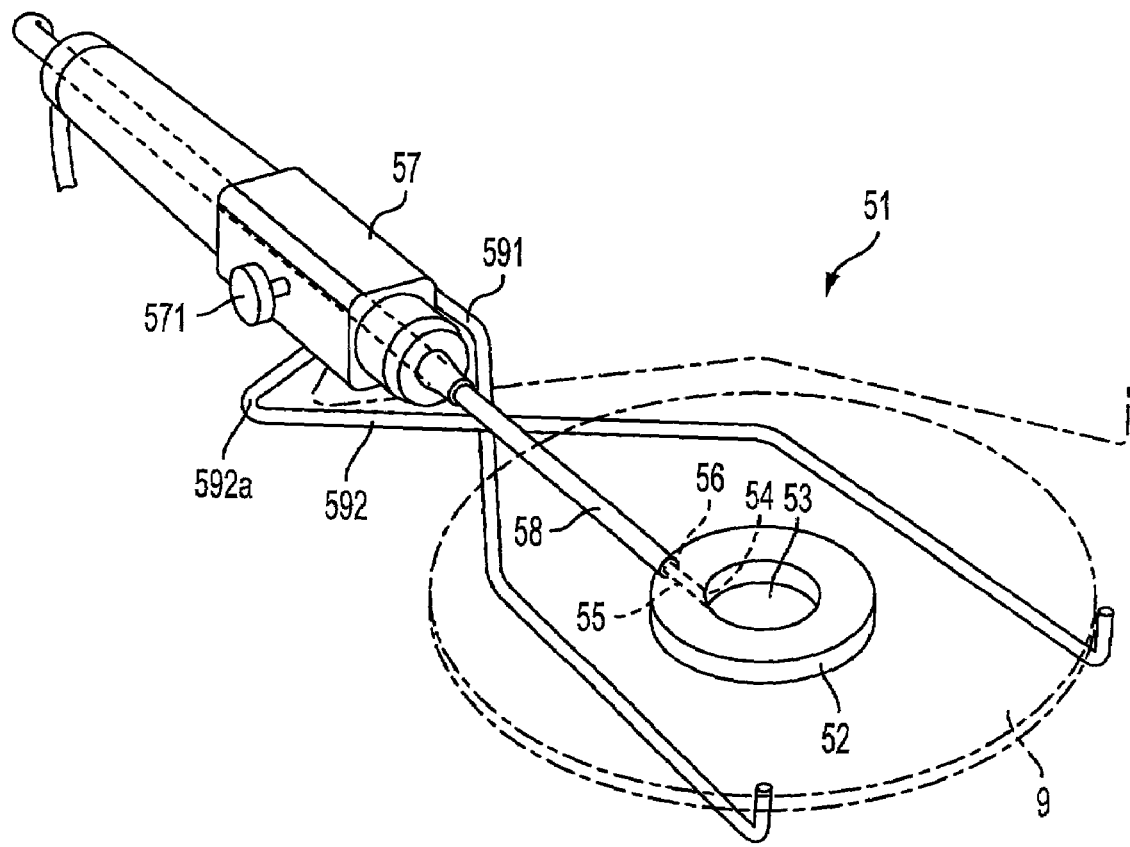
FIG. 13 is a perspective view of the sixth embodiment of non-contacting conveyance equipment.

Next, the sixth embodiment of the non-contacting conveyance equipment of the present invention is explained using FIG. 13.

FIG. 13 is a perspective view of the sixth embodiment of non-contacting conveyance equipment. Non-contacting conveyance equipment 51 is equipped with fluid piping 58, which penetrates inside a fluid swirl formation object 52 to a circumference-like concave part 53, and also penetrates inside a long and slender pillar-shaped grasping part 57, and fluid swirl formation object 52 is fixed to the end of fluid piping 58 in FIG. 13.

Fluid introduction mouth 56 (which opens to the perimeter side of concave part 53), spout 54 (which is faced at concave part 53), and fluid introduction mouth 56 and spout 54 are prepared in fluid passage 55 by fluid swirl formation object 52. Fluid piping 58 is connected to fluid introduction mouth 56, and air supplied from fluid piping 58 is breathed out along the direction of a circumference through fluid introduction mouth 56 and fluid passage 55 in a concave 53 from a spout 54, and serves as a fluid swirl inside concave part 53.

From a grasping part 57, two bent guide arms 591, 592 extend through both sides of concave part 53, and are bent perpendicularly at each tip end. If guide arm 592 is pushed in at partial bend 592a, guide arm 592 moves away from guide arm 591, which is fixed. According to the operation, if partial bend 592a is being pushed in by an operator grasping the grasping part 57, and the pushing is canceled, then guide arm 592 will return to its original position.

Moreover, an opening-and-closing switch 571 opens and closes the passage of fluid piping 58 formed in grasping part 57.

Wafer 9 can be held, even if only one fluid swirl formation object 52 is formed, because of the powerful attraction, and the non-contacting conveyance equipment 51 of the above-mentioned construction holds wafer 9 by non-contacting, as in the case of each of the above-mentioned embodiments, using the outflow of the fluid swirl formed in concave 53. Therefore, by fixing one fluid swirl formation object 52 to the end of fluid piping 58, and by holding grasping part 57, and operating it by hand, wafer 9 is held freely as with tweezers and can be conveyed to a desired position. When catching wafer 9, partial bend 592a is pushed in, which moves guide arm 592 to the open position of the dotted lines of FIG. 13, wafer 9 becomes easy to catch, concave part 53 is brought close to wafer 9 with guide arms 591, 592 in an open state, and maintenance by non-contacting is caused to perform, since guide arms 591,592 are formed. Then, at the time of conveyance, pushing of partial bend 592a is canceled, guide arm 592 returns to its original position, and wafer 9 can be conveyed with movement of wafer 9 prevented and stabilized by the perpendicular bending portions formed in the ends of guide arms 591,592. Thus, like tweezers, non-contacting conveyance equipment 51 in this sixth? embodiment is free to catch and convey wafer 9.

Although air is used as fluid, gases or liquids other than air may be used in each of the above-mentioned embodiments.

Moreover, although it was explained above that the object held by non-contacting was a silicon wafer, the present invention is also considered ideal for holding by non-contact objects other than wafers.

Moreover, although each of the concave parts 3, 33, 43, and 53 were explained as having a circumference-like shape, the concave parts 3, 33, 43, and 53 may be formed as other shapes, such as a polygon-like shape.

Next, a seventh embodiment of the non-contacting conveyance equipment of the present invention is explained with reference to FIG. 14.

Figure 14:
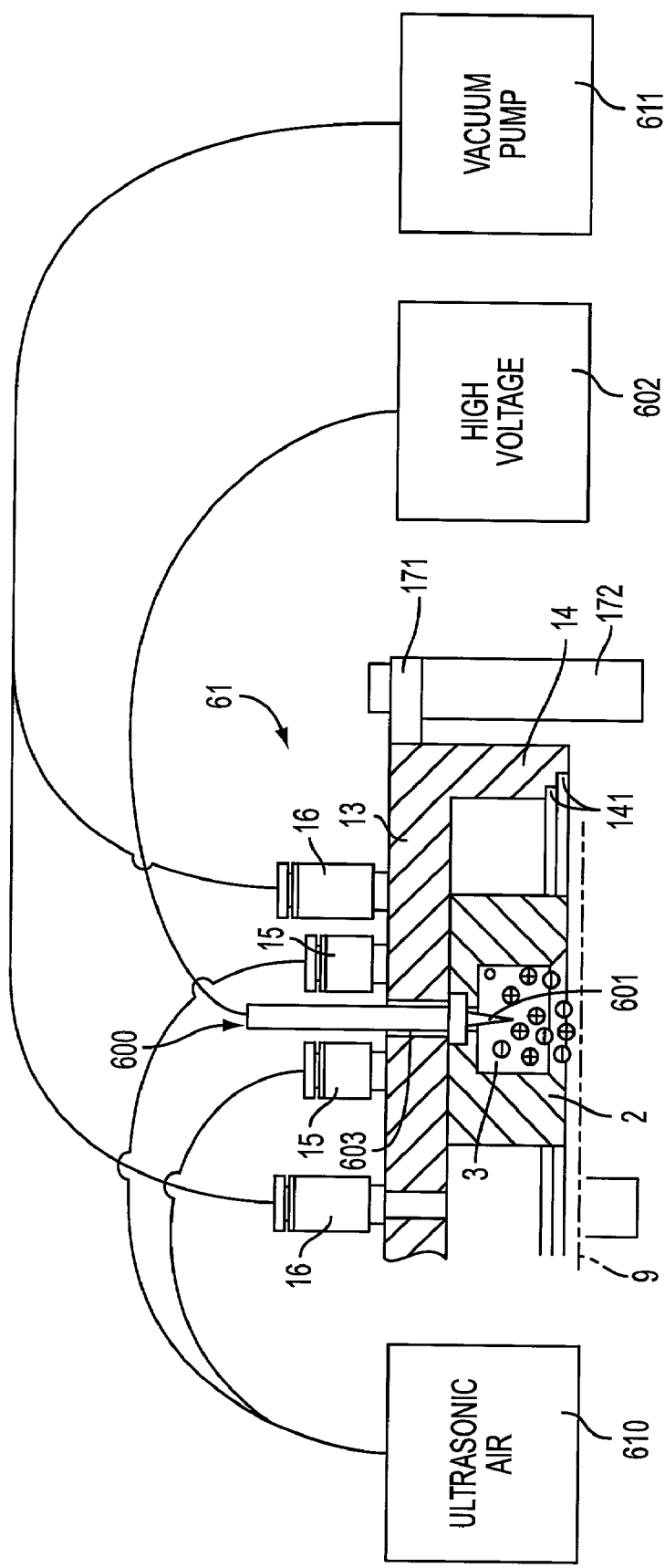
FIG. 14 is a partial front sectional view of the seventh embodiment of non-contacting conveyance equipment.

FIG. 14 is a partial front sectional view of the seventh embodiment of non-contacting conveyance equipment. The construction element in the second embodiment described above is used in this seventh embodiment, and the same numerals are allocated to the same elements, explanation omitted.

Non-contacting conveyance equipment 61 of the seventh embodiment differs from the above-mentioned non-contacting conveyance equipment 11 of the second embodiment at the following points. First, at the point which was open for free passage of the ultrasonic air source 610, which forms two fluid supply mouths 15 in each of the fluid swirl formation objects 2, and which vibrates at an ultrasonic frequency for each. Second, at a point established so that the inside of concave part 3 of fluid swirl formation object 2 might be faced with an ion generation source 600.

Ion generation source 600 has an electric pole needle 601 and a high-voltage power supply 602 that supplies high voltage to electric pole needle 601, as shown in FIG. 14. Electric pole needle 601 is formed so that the tip faces the internal space of concave part 3 of fluid swirl formation object 2, from a hole 603 prepared in base 13. By supplying high voltage, ions are generated around the tip portion of electric pole needle 601. Moreover, from fluid supply mouth 15, the ultrasonic air supplied from ultrasonic air source 610 is used as the supply fluid.

Electric-pole needle 601 generates ions with polarity according to the polarity of the voltage supplied. The ions are carried to the ultrasonic air supplied from fluid supply mouth 15, and pass through to the surface of wafer 9 which is held by non-contacting. The ions are attracted by fluid outlet 16, which is open for free passage to vacuum pump 611, and are discharged to the outside via vacuum pump 611.

Usually, the removal of particles from wafers is difficult because particles tend to adhere to the wafer surface when wafer 9 is charged. In this seventh embodiment, as mentioned above, since ions are blown and contact the surface of wafer 9, the electrification is neutralized and adhesion of particles by static electricity is weakened. Therefore, the supply fluid from fluid supply mouth 15 can easily remove the particles, whose adhesion is weakened, and the surface of wafer 9 is cleaned. The removed particles are discharged with supply fluid from fluid outlet 16.

The supply fluid in this seventh embodiment is also converted into ultrasonic air. The oscillating air of this ultrasonic fluid acts to vibrate the air layer near the wafer surface and thereby exfoliates particles from the surface of wafer 9. The action effect of particle removal is strengthened further and particles on wafer 9 are more reliably removed. Moreover, since wafer 9 is neutralized with ions, particle adhesion to wafer 9 by subsequent electrification can be prevented.

In addition, in this embodiment, although ion generation source 600 and ultrasonic air source 610 are used together, even when only one of these two sources is used, the effect of particle removal will still be demonstrated. For example, without preparing an ion generation source 600 in the fluid supply mouth, ultrasonic air source 610 is made to open for free passage and it supplies ultrasonic air fluid. Moreover, only an ion generation source 600 can be prepared in the fluid supply mouth, and it will supply normal non-ultrasonic fluid. The effect of particle removal can be demonstrated in either case.

Non-contacting conveyance equipment 61 of this seventh embodiment is capable of holding and conveying an object by non-contacting. Moreover, it can now serve as both static electricity removal equipment that neutralizes static electricity, and as cleaning equipment that removes particles by preparing an ion generation source. Moreover, it can serve as cleaning equipment that performs particle removal by using only ultrasonic air for the supply fluid. Furthermore, by making the supply fluid into ultrasonic air while preparing an ion generation source, this equipment can now serve as the both static electricity removal equipment and cleaning equipment, and can still realize various functions of non-contacting conveyance equipment.

Figure 15:
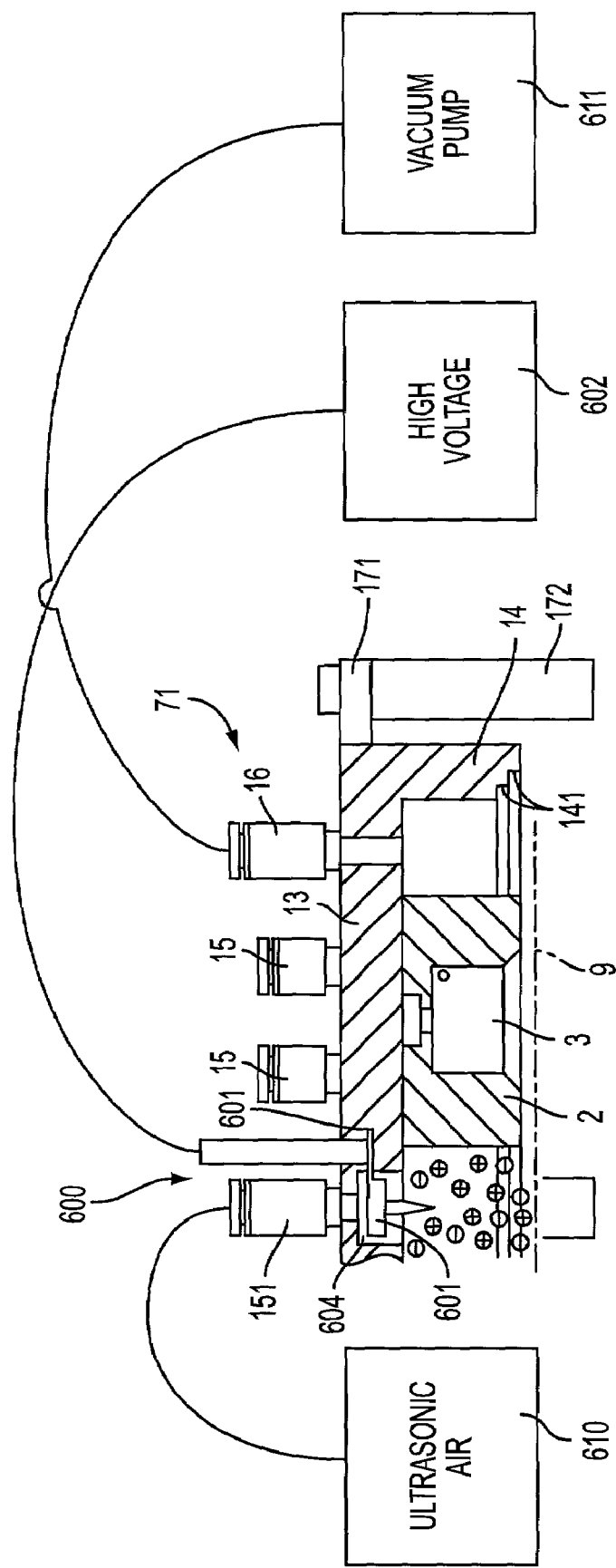
FIG. 15 is a partial front sectional view of the eighth embodiment of the non-contacting conveyance equipment.

FIG. 15 is a partial front sectional view of the eighth embodiment of the non-contacting conveyance equipment.

The point at which non-contacting conveyance equipment 71 of this 8th embodiment differs from the above-mentioned non-contacting conveyance equipment 61 of the seventh embodiment is the point in the seventh embodiment which did not form electric pole 601 of ultrasonic air source 600 in fluid swirl formation object 2, but was rather formed so that wafer 9 currently held by non-contacting might be attained. That is, the point in the eighth embodiment where an electric pole 601 is formed in base 13, not a fluid swirl formation object 2, and wafer 9 currently held by non-contacting is made to overlook the tip of an electric pole 601. Moreover, the eighth embodiment differs at the point where fluid supply mouth 151 leads to ultrasonic air source 610, formed at hole 604.

Thus, since the ions generated by electric pole 601 contact the surface of wafer 9, the eighth embodiment demonstrates at least the same non-contacting effect as that of the seventh above-mentioned embodiment. In addition, though fluid supply mouth 151 which supplies ultrasonic air in this case has an additional fluid supply mouth 15 supplying fluid swirl formation object 2, the flux of the ultrasonic air is enough if it is the flux of the fluid which arrives at the surface of wafer 9. Also, the non-contacting maintenance of wafer 9 held by the fluid supplied to fluid swirl formation object 2 is not affected.

Moreover, the particles removed by the ions and ultrasonic air are promptly discharged via fluid outlet 16 prepared in two or more places in base 13.

In addition, although the seventh and the eighth embodiments are constructed so that the ultrasonic air from source 610 of ultrasonic air can be ionized by electric pole 601, these may also be constructed such that the air is first ionized by the electric pole, and then fed to the ultrasonic air source, so that the ionized air may be given ultrasonic vibration. As long as the ionized ultrasonic air finally contacts the object held by non-contacting, either construction is acceptable.

Since the present invention consists of the above-mentioned construction, the effects explained below can also be accomplished.

The present invention performs non-contacting maintenance of an object by the use of a concave part, a flat surface, and a fluid passage. Therefore, the equipment can be easily constructed and the cost of manufacturing the equipment is reduced sharply.

Moreover, because the equipment is easily constructed, it is also easily miniaturized. So miniaturized, it can be used and inserted into spaces not used conventionally. The action range of the equipment can be extended, and conveyance movement in a narrow domain within the same process and processing equipment can also be freely performed.

Moreover, the air blown into the concave part serves as a fluid swirl, smoothly flowing, receiving minimal passage resistance. Therefore, energy efficiency can be improved and energy curtailment can be realized.

Furthermore, air is made to blow off in a circumferential direction in the concave part, generating a fluid swirl. Therefore, the power of attraction by the negative pressure between a flat surface and an object can be markedly increased as compared with conventional devices, allowing powerful performance of non-contacting maintenance.

The present invention may be made to attract a object by the fluid swirl formed by two or more concave parts, increasing the power of attraction markedly, and due to such power, the whole of an object is more powerfully attracted. Therefore, it becomes possible to correct a curvature of the whole object (for example, wafer). Consequently, even in a case where a large diameter object has a curvature, the object can be reliably held by non-contacting, and when conveyance is stabilized, it can carry the object with certainty.

A concave part is formed in a board-like base, a fluid swirl is formed therein, and non-contacting maintenance may be performed. For this reason, conventionally stacked wafers may be freely accessed and attained, even when the wafers are in a difficult to access wafer cassette, or the wafer of which stage. A wafer retrieved from the wafer cassette can be conveyed more smoothly and freely. Moreover, in the case where a wafer cassette is contained and loaded with the wafer, it can be freely carried to a desired position. That is, the acts of taking out from the wafer cassette and carrying in to the wafer cassette can be performed freely, and working efficiency can be raised sharply.

Moreover, the non-contacting maintenance power is great, and even if the non-contacting conveyance equipment reverses, the state is maintained. Moreover, the wafer can be reversed and the wafer cassette can also be loaded, reversed, and conveyed to a subsequent processing stage.

Moreover, ions from an ion supply source are caused to contact an object. Therefore, the electrification is neutralized and adhesion of particles by static electricity to an object is weakened. The supply fluid can easily remove particles whose static adhesion is weakened, consequently cleaning the object.

While the invention has been described in detail with respect to specific embodiments thereof, it will be appreciated that those skilled in the art, upon obtaining an understanding of the foregoing may readily conceive of alterations to, variations on and equivalents to these embodiments. Accordingly, the scope of the present invention should be assessed as that of the appended claims and any equivalents thereto.

What is claimed is:

1. A non-contacting conveyance equipment comprising:
a body having an end face that opposes an object being conveyed, and at least one concave opening formed in the end face and surrounded by a cylindrical inner side wall;
at least one fluid passageway having at least one spout to introduce fluid into an inner space of the concave opening in one circumferential direction of the cylindrical inner sidewall so as to cause a swirl of fluid within the concave opening, the at least one spout being formed on the cylindrical inner sidewall;
a centering guide; and
a centering mechanism provided at the body to adjust the centering guide to cause the centering guide to control a lateral movement of the object, wherein the centering mechanism comprises:
a rotatable disk; and
at least one arm linking the centering guide to the rotatable disk such that rotation of the rotatable disk changes a radial distance of the centering guide from the center of the non-contacting conveyance equipment.

2. A non-contacting conveyance equipment according to claim 1, wherein the centering mechanism is pneumatically driven.

3. A non-contacting conveyance equipment to convey an object comprising:
a base;
a centering guide;
a plurality of fluid swirl formation objects which are provided at the base; and
a centering mechanism which is provided at the base and adjusts the centering guide in a direction towards the object to cause the centering guide to control a lateral movement of the object being conveyed,
wherein each of the plurality of fluid swirl formation objects comprises:
a body having an end face that opposes the object conveyed, and a concave opening formed in the end face and surrounded by a cylindrical inner side wall, and
at least one fluid passageway having at least one spout to introduce fluid into an inner space of the concave opening in one circumferential direction of the cylindrical inner side wall so as to cause a swirl of fluid within the concave opening, the at least one spout being formed on the cylindrical inner side wall;

wherein the centering mechanism comprises:

a rotatable disk; and at least one arm linking the centering guide to the rotatable disk such that rotation of the rotatable disk changes a radial distance of the centering guide from the center of the non-contacting conveyance equipment.

4. A non-contacting conveyance equipment according to claim 3, wherein the centering mechanism is pneumatically driven.

5. Non-contacting conveyance equipment comprising:

a hole-shaped concave opening having a continuous walled inner peripheral surface;

an end face that opposes an object to be conveyed, the end face being formed in the concave opening;

a fluid passageway comprising a spout facing the inside of the concave opening, to supply fluid to the inner peripheral surface of the concave opening so as to cause a swirl of fluid within the concave opening; and a centering guide to maintain the object to be conveyed such that the object opposes the end face, wherein the non-contacting conveyance equipment has an outer periphery, the centering guide comprises at least three centering protrusions provided around the outer periphery, the centering protrusions are radially displaced from a center of the non-contacting conveyance equipment, and the non-contacting conveyance equipment further comprises a centering mechanism to vary the radial distance of the centering protrusions from the center of the non-contacting conveyance equipment, wherein the centering mechanism comprises:

a rotatable disk; and arms linking each centering protrusion to the rotatable disk such that rotation of the rotatable disk changes the radial distance of the centering protrusions from the center of the non-contacting conveyance equipment.

6. Non-contacting conveyance equipment according to claim 5, wherein the centering mechanism is pneumatically driven.

7. Non-contacting conveyance equipment comprising:

a hole-shaped concave opening having a continuous walled inner peripheral surface;

an end face that opposes an object to be conveyed, the end face being formed in the concave opening;

a fluid passageway comprising a spout facing the inside of the concave opening, the fluid passageway ending at an opening through the inner peripheral surface, to supply fluid to the inner peripheral surface of the concave opening so as to cause a swirl of fluid within the concave opening; and a centering guide to maintain the object to be conveyed such that the object opposes the end face, wherein the non-contacting conveyance equipment has an outer periphery, the centering guide comprises at least three centering protrusions provided around the outer periphery, the centering protrusions are radially displaced from a center of the non-contacting conveyance equipment, and the non-contacting conveyance equipment further comprises a centering mechanism to vary the radial distance of the centering protrusions from the center of the non-contacting conveyance equipment, wherein the centering mechanism comprises:

a rotatable disk; and arms linking each centering protrusion to the rotatable disk such that rotation of the rotatable disk changes the radial distance of the centering protrusions from the center of the non-contacting conveyance equipment.

8. Non-contacting conveyance equipment according to claim 7, wherein the centering mechanism is pneumatically driven.

9. A non-contacting conveyance equipment to convey an object comprising:

a base, wherein the base comprises a base part and first and second arm parts which branch from the base in a prong arrangement; and a plurality of fluid swirl formation objects which are provided at the first and second arm parts, wherein:

each of the plurality of fluid swirl formation objects comprises:

a body having an end face that opposes the object, and a concave opening formed in the end face and surrounded by a cylindrical inner side wall, and at least one fluid passageway having at least one spout to introduce fluid into an inner space of the concave opening in one circumferential direction of the cylindrical inner side wall so as to cause a swirl of the fluid within the concave opening, the at least one spout being formed on the cylindrical inner side wall, among the plurality of fluid swirl formation objects provided at the first and second arm parts, the fluid swirls in a first direction in the fluid swirl formation objects provided in at the first arm part, and the fluid swirls in a second direction opposite to the first direction in the fluid swirl formation objects provided in the second arm part, and the plurality of fluid swirl formation objects extending from respective surfaces of the first and second arm parts such that the respective end faces are at different levels from the respective surfaces of the first and second arm parts.

* * * * *